United States Patent [19]

Webb et al.

[11] Patent Number: 4,794,439
[45] Date of Patent: Dec. 27, 1988

[54] REAR ENTRY PHOTODIODE WITH THREE CONTACTS

[75] Inventors: Paul P. Webb, Beaconsfield, Canada; John R. Appert, Levittown, Pa.; Ronald E. Enstrom, Skillman, N.J.

[73] Assignee: General Electric Company, Schenectady, N.Y.

[21] Appl. No.: 28,155

[22] Filed: Mar. 19, 1987

[51] Int. Cl.$^4$ .......................................... H01L 27/14
[52] U.S. Cl. ..................................... 357/30; 357/55; 357/56; 357/16; 357/58
[58] Field of Search ...................... 357/17, 30 A, 30 B, 357/30 E, 56, 55, 58

[56] References Cited

U.S. PATENT DOCUMENTS

| | | | |
|---|---|---|---|
| 4,396,443 | 8/1983 | Lewerenz et al. | 148/171 |
| 4,455,351 | 6/1984 | Camlibel et al. | 428/450 |
| 4,561,007 | 12/1985 | Webb | 357/30 |

FOREIGN PATENT DOCUMENTS

| | | | |
|---|---|---|---|
| 61-185977 | 8/1986 | Japan | 357/30 A |
| 2133928A | 8/1984 | United Kingdom . | |
| 2168527A | 6/1986 | United Kingdom . | |

OTHER PUBLICATIONS

Uwai et al., "Er-Doped InP and GaAs Grown by Metalorganic Chemical Vapor Deposition," *Appl. Phys. Lett.*, vol. 51, No. 13, Sep. 28, 1987, 1010-1012.
Tomaseha, "GaAs Optical Electronic Devices for Signal Processing Applications," *SPIE Guided Wave Optical Systems & Devices II* (1979); Conference: Washington, DC, 17-18, Apr. 1979, pp. 111-114.
Susa et al., "Characteristics in InGaAs/InP Avalanche Photodiodes with Separated Absorption and Multiplication Regions," *IEEE Journal of Quantum Electronics*, vol. QE-17, No. 2, Feb. 1981, pp. 243-249.
Law et al., "Ion-Implanted in GaAsP Avalanche Photodiode," *Appl. Phys. Lett.*, 33(11), Dec. 1, 1978, pp. 920-922.

Primary Examiner—Andrew J. James
Assistant Examiner—William A. Mintel
Attorney, Agent, or Firm—Henry I. Steckler; James C. Davis, Jr.; Paul R. Webb, II

[57] ABSTRACT

A semiconductor photodiode includes a substrate of semi-insulating indium phosphide having a first layer of highly doped P type indium phosphide on a surface thereof. An active second layer of N type indium gallium arsenide is on the first layer and a third layer of N type indium gallium arsenide or indium phosphide is on the second layer. The third layer may be entirely more highly doped than the second layer or may have a highly doped region on its surface. A first contact is on the third layer and a second contact is on the first layer. A buffer layer of lightly doped N or P type indium phosphide may be provided between the first layer and the second layer.

12 Claims, 1 Drawing Sheet

U.S. Patent  Dec. 27, 1988  4,794,439

REAR ENTRY PHOTODIODE WITH THREE CONTACTS

The present invention relates to a rear entry photodiode, and more particularly, to such a photodiode having reduced capacitance and improved transmission of light into the active region of the diode.

BACKGROUND OF THE INVENTION

A semiconductor photodiode in general includes a substrate of semiconductor material having at least one epitaxial layer of semiconductor material on a surface thereof in which is included adjacent regions of opposite conductivity type forming a PN junction or an intrinsic region between spaced regions of opposite conductivity type forming a PIN device. These regions of opposite conductivity type may be formed by successive growth of appropriately doped epitaxial layer or by other techniques, such as ion implantation or diffusion. Also, the particular semiconductor material used is dependent on the wavelength of the light to be detected. Recently, photodiodes having one or more epitaxial layers of indium gallium arsenide (InGaAs) on a substrate of indium phosphide (InP) have come into use for detecting light in the wavelength range of approximately 1 to 1.6 micrometers.

In one type of photodiode, the light being detected is directed into the diode through the topmost layer. This type of photodiode generally includes a layer of insulating material on the surface of the topmost layer. In a photodiode which is of a planar geometry, the insulating layer serves the purpose of passivating the diode, and may also serve as an antireflection coating for light entering from this surface. The insulating layer has an opening therethrough through which a conductive layer extends to make contact with a portion of the topmost layer. The contact may also extend over the insulating layer in the form of a pad to which a terminal can be attached. A problem with this type of photodiode is that the additional diode area required for electrical contact plus the contact pad on the upper surface of the insulating layer provides additional capacitance which adversely affects the sensitivity of the photodiode in certain amplifier configurations.

In another type of photodiode, the light being detected is directed into the diode through the substrate. In this type of photodiode the conductive contact for the topmost layer can be applied over the whole area of the diode to serve as the contact pad. This reduces the capacitance of the device. However, this type of device has a problem in that the substrate is generally highly doped so as to have a low resistance, and the highly doped material is absorbtive of the light so that not all the light reaches the active layer.

SUMMARY OF THE INVENTION

A semiconductor photodiode includes a substrate of semi-insulating semiconductor material having a pair of opposed major surfaces. A conductive first layer of the same semiconductor material as the substrate and of one conductivity type is on one of the major surfaces of the substrate. A second layer of a semiconductor material which absorbs the wavelength of the radiation to be detected is on the first layer with said second layer being of the opposite conductivity type. A third layer of a semiconductor material of the opposite conductivity type is on the second layer with said third layer including at least a portion at its surface which is of high conductivity. A first contact is on the high conductivity portion of the third layer and a second contact extends to said first layer.

DETAILED DESCRIPTION OF PREFERRED EMBODIMENT

Figure 1:
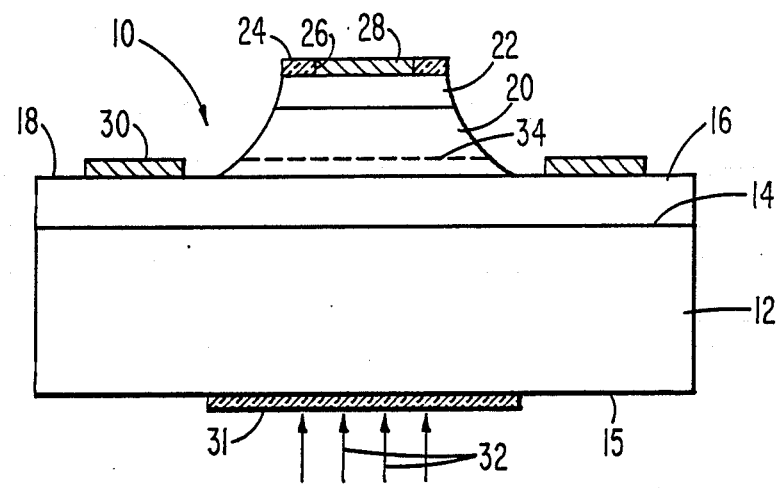
FIG. 1 is a sectional view of one form of a semiconductor photodiode which incorporates the present invention.

Referring initially to FIG. 1, one form of a semiconductor photodiode of the present invention is generally designated as 10. Photodiode 10 includes a substrate 12 of a semi-insulating semiconductor material having a pair of opposed major surfaces 14 and 15. On the surface 14 of the substrate 12 is a first layer 16 of the same semiconductor material as the substrate 12. The first layer 16 is of one conductivity type and is highly doped so as to be conductive. On the surface 18 of the first layer 16 is a second layer 20 of a semiconductor material which will absorb the light as the wavelength being detected. The second layer 20 is the active layer of the photodiode 10. The layer 20 is of the conductivity type opposite that of the first layer 16 and is lightly doped. On the second layer 20 is a third layer 22 of the same semiconductor material as either the second layer 20 or the first layer 16. The third layer 22 is of the same conductivity type as that of the second layer but is highly doped so as to be conductive. The second and third layers 20 and 22 are smaller in area than the first layer 16 so as to form a mesa and to expose a portion of the surface 18 of the first layer 16. During the formation of the photodiode 10, conductivity modifiers from the first layer 16 diffuse a distance into the second layer 20, forming a PN junction 34 therein.

An insulating layer 24, such as of a silicon oxide, is on the third layer 22 and has an opening 26 therethrough which exposes a portion of the surface of the third layer 22. A conductive metal contact 28 is on the exposed portion of the surface of the third layer 22 within the opening 26 and makes ohmic contact with the third layer 22. A second conductive metal contact 30 is on the exposed portion of the surface 18 of the first layer 16 and makes ohmic contact with the first layer 16. The contacts 28 and 30 are of an area large enough to serve as a terminal pad for attaching a terminal thereto. The surface 15 of the substrate 12 is polished and an antireflection coating 31, such as of silicon oxide is on the surface 15.

Preferably, the substrate 12 is of single crystalline indium phosphide (InP) doped with iron so as to be semi-insulating. The first layer 16 is also of single crystalline indium phosphide doped with zinc or cadmium at a concentration of about $5 \times 10^{-}\text{cm}^{-3}$ so as to be highly conductive P type. The first layer 16 is preferably between 2 and 3 microns in thickness. The second layer 20 is preferably single crystalline indium gallium arsenide ($In_{0.53}Ga_{0.47}As$) lattice-matched to the indium phosphide first layer 16 and is grown so as to be lightly doped N type. The second layer 20 is of a thickness between about 2 and 4 microns. The third layer 22 is of the same material as either the second layer 20 or the first layer 16, but is doped with sulfur to a concentration of about $2 \times 10^{18}$ cm$^{-3}$ so as to be highly conductive N type. The third layer 22 is of a thickness of between 1 and 2 microns. The contacts 28 and 30 are of materials which are highly conductive and which make good ohmic contact to their respective layers of the photodiode. For example, the contact 28 to the N type third layer 22 may be a thin layer of a gold-germanium or gold-tin alloy directly on the third layer 22. The contact 30 to the P type indium phosphide layer 16 may be a thin layer of a gold zinc alloy directly on the first layer 16.

The photodiode 10 may be made by epitaxially depositing the first layer 16, second layer 20 and third layer 22 on the substrate 12 in succession. The layers may be deposited on the substrate 12 by liquid phase, vapor phase or any other suitable epitaxial technique. When the three layers are so deposited on the substrate 12, all three of the layers will then extend over the entire area of the substrate surface 14. The insulating layer 24 would then be deposited over the entire surface of the third layer 22, such as by chemical vapor deposition. Using a photoresist as a mask, the opening 26 would then be etched through the insulating layer 24. The contact 28 would then be deposited such as by sputtering or evaporation in a vacuum, and defined to cover the exposed portion of the surface of the third layer 22 using standard photolithographic techniques and etching. Using standard photolithographic techniques, the resist mask is formed on the oxide layer 24 and contact 28 over the area of the third layer 22 which is to form the mesa. The uncovered portion of the insulating layer 24 is then removed with a suitable etchant and the third layer 22 and second layer 20 are etched away in succession down to the first layer 16 to form the mesa. The third layer 22 is etched away using any suitable etchant, such as bromine and methanol, and the second layer 20 is preferably etched with a preferential etch, such as Caros acid, which will etch indium gallium arsenide but will stop at the indium phosphide first layer 16. The contact 30 is then formed on the exposed area of the first layer 16, such as by sputtering or evaporation in a vacuum and defined using standard photolithographic techniques and etching. A final light etch of the mesa surfaces may be necessary to achieve good diode characteristics.

In the operation of the photodiode 10, light enters the photodiode 10 through the substrate 12 as indicated by the arrows 32. The semi-insulating material of the substrate 12 has very low optical absorption so that a high percentage of the light passes through the substrate 12 and the first layer 16 and across the PN junction 34 and into the active second layer 20. The photons crossing the PN junction 34 are absorbed in the second layer 20 thus producing electron-hole pairs which are swept to the contacts of the photodiode 10 when the photodiode is properly biased. By having the PN junction 34 before the active second layer 20, the photons are absorbed in the active layer 20, adjacent to the junction, thus enhancing the collection probability of the carriers, and reducing the collection time. In the photodiode 10 the contact 28 may cover most of the area of the diode surface 24, thereby eliminating unnecessary additional diode on contact areas, and therefore reducing the capacitance of the device.

A problem which can arise with the photodiode 10 is that the zinc or cadmium used to dope the P type indium phosphide first layer 16 is subject to rapid diffusion when the device is heated, particularly during the deposition of the second and third layers and other steps in the process of making the photodiode 10. When this zinc or cadmium diffuses across the surface 18, it compensates a portion of the second layer 20, thereby forming a PN junction 34 a distance from the surface 18. If the amount of diffusion is large, so that the distance between the junction 34 and the surface 18 is large, a substantial thickness of heavily doped P-type indium-gallium-arsenide may be formed, thereby forming a region in which incoming radiation 32 is absorbed, but from which the collection of carriers so formed is poor. This would result in a loss of efficiency of the photodiode.

Figure 2:
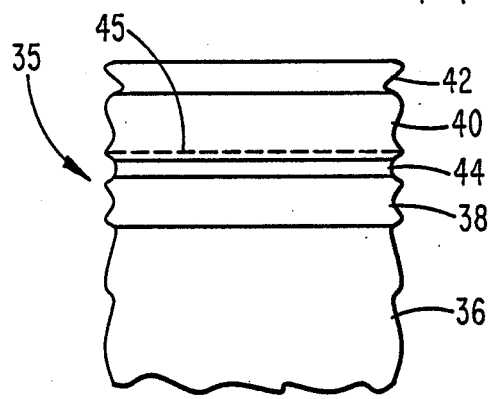
FIG. 2 is a sectional view of a portion of another form of the photodiode of the present invention.

One method of overcoming this problem is shown in FIG. 2. The modification of the photodiode of the present invention shown in FIG. 2 is generally designated as 35. The photodiode is of the same construction as the photodiode 10 shown in FIG. 1 in that it includes a substrate 36 of semi-insulating semiconductor material, preferably indium phosphide, a first layer 38 of P type indium phosphide on the substrate 36, a second layer 40 of lightly doped N type indium gallium arsenide and third layer 42 of highly doped N type indium gallium arsenide or indium phosphide. The photodiode 35 includes a pair of contacts not shown. The photodiode 35 differs from the photodiode 10 in that it includes a buffer layer 44 of indium phosphide which is not intentionally doped between the first layer 38 and the second layer 40. The buffer layer 44 is of a thickness about 1 to 2 microns and may be slightly N or P type. In the making of the photodiode 35, during any step in which the photodiode is heated to a temperature which would cause diffusion of the zinc or cadmium dopant in the first layer 38, the zinc or cadmium will diffuse through the buffer layer 44 and slightly into the second layer 40, thereby forming a PN junction 45 a distance into the second layer 40. In this modification of the photodiode, the P-type doping in the second layer 40 is low and the depth of the PN junction 45 from the buffer layer 44 is small thereby avoiding loss of efficiency of the photodiode 35.

Figure 3:
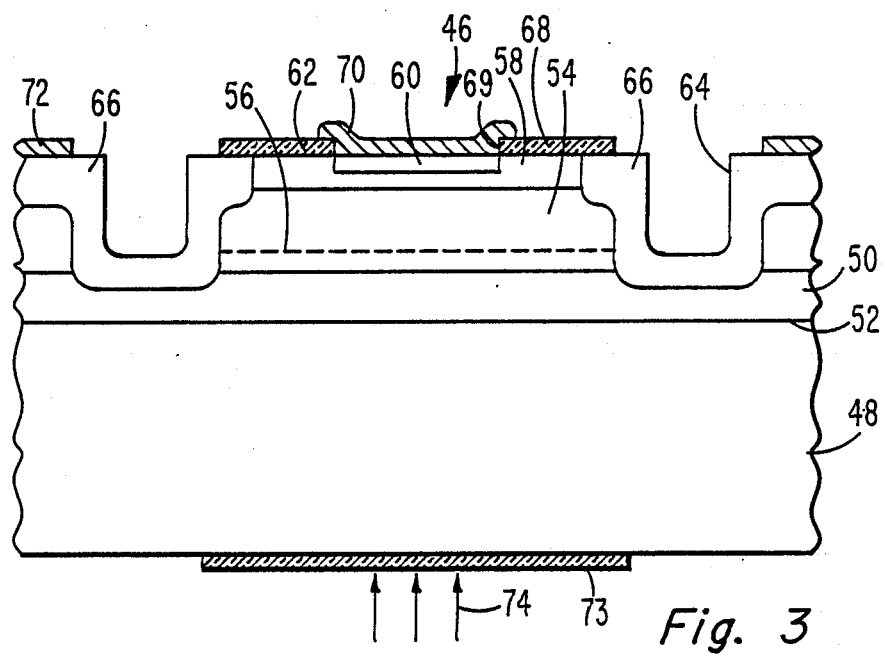
FIG. 3 is a sectional view of a third form of the semiconductor photodiode of the present invention.

Referring to FIG. 3, a planar form of the photodiode of the present invention is generally designated as 46. Photodiode 46, like the photodiode 10 in FIG. 1, includes a substrate 48 of intrinsic semiconductor material, such as iron doped indium phosphide. A first layer 50 of highly doped P type indium phosphide is on the surface 52 of the substrate 48. A second layer 54 of lightly doped N type indium gallium arsenide is on the first layer 50 and has a PN junction 56 therein. A third layer 58 of semiconductor material is on the second layer 54. In the photodiode 46 the third layer 58 is a capping layer of lightly doped N type indium phosphide. The third layer 58 includes a highly doped contact region 60 therein along its surface 62.

An annular groove 64 extends into and through the third layer 58 from its surface 62 and into the second layer 54. Although, as shown, the groove 64 does not extend completely through the second layer 54, it can extend to the first layer 50. The groove 64 is of a diameter to circumscribe a desired area of the second layer 54 to achieve the particular operating characteristics for the photodiode 46. A highly conductive P type contact region 66 extends along the sides and bottom of the groove 64 and extends radially outwardly from the groove along the surface 62 of the third layer 58. At the bottom of the groove 64 the contact region 66 extends into the first layer 50. An insulating layer 68 such as of a silicon oxide, is on the surface 62 of the third layer 58 circumscribed by the annular groove 64. The insulating layer 68 has an opening 69 therethrough exposing the contact region 60 in the third layer 58. A conductive metal contact 70 is on the surface 62 within the opening 69 and makes ohmic contact with the contact region 60. A conductive contact 72 is on the surface 62 around the outer periphery of the groove 64 and makes ohmic contact with the contact region 66. The back surface of the substrate 48 is polished and an anti-reflection coating 73 is on the back surface.

The photodiode 46 may be made by epitaxially depositing the first layer 50, second layer 54, and third layer 58 on the surface 52 of the substrate 48 in succession. The insulating layer 68 may then be deposited on the surface 62 of the third layer 58 and, using standard photolithographic techniques and etching, defined to its desired area and provided with the opening 69 therethrough. While masking the surface 62 and the insulating layer 68 with a resist, the groove 64 may then be etched through the third layer 58 and the second layer 54. A P type dopant, such as zinc, can then be diffused into the sidewalls and bottom of the groove 64 and into the third layer 58 radially outwardly from the groove 64 to form the contact 66. The contact region 60 can then be formed by implanting N type conductivity modifiers, such as silicon, into the third layer 58 through the opening 70 in the insulating layer 68 followed by a thermal annealing to activate the region. Each of the contacts 70 and 72 may then be applied using either sputtering or evaporation in a vacuum. If desired, a lightly doped P type indium phosphide buffer layer, such as the buffer layer 44 shown in the photodiode 35 of FIG. 2, may be provided between the first layer 50 and the second layer 54 to minimize diffusion of zinc into the second layer 54, thereby avoiding loss of light detection efficiency.

The photodiode 46 operates in the same manner as the photodiode 10 previously described. Light is directed into the photodiode 46 through the substrate 48 as indicated by the arrows 74. The light passes through the substrate 48, the first layer 50 and across the PN junction 56 where the light is absorbed in the active layer 54 and converted to electron-hole pairs. Since the substrate 48 is of a semi-insulating material, little of the light is absorbed in the substrate 48 so a high efficiency of the light reaches the PN junction to form the electron-hole pairs. Thus, there is provided by the present invention a photodiode which provides a relatively high efficiency for the detection of the light, and which has a relatively low capacitance since the diode and contact areas have been minimized.

We claim:

1. A semiconductor photodiode comprising
  a substrate of semi-insulating semiconductor material having a pair of opposed major surfaces,
  a conductive first layer of the same semiconductor material as the substrate and of one conductivity type on one of the major surfaces of the substrate,
  a second layer of a semiconductor material which absorbs the wavelength of the radiation to be detected on the first layer, said second layer being of the opposite conductivity type,
  a third layer of a semiconductor material of the opposite conductivity type on said second layer, said third layer including at least a portion at its surface which is of high conductivity,
  a first contact to said highly conductive portion of said third layer, and
  a second contact to said first layer.

2. A semiconductor photodiode in accordance with claim 1 in which the substrate and first layer are each of indium phosphide and the second layer is of indium gallium arsenide.

3. A semiconductor photodiode in accordance with claim 2 in which the substrate is doped with iron so as to be semi-insulating.

4. A semiconductor photodiode in accordance with claim 3 in which the first layer is of P type conductivity and the second and third layers are of N type conductivity.

5. A semiconductor photodiode in accordance with claim 4 in which the entire third layer is more heavily doped than the second layer so as to be more conductive.

6. A semiconductor photodiode in accordance with claim 5 in which the third layer is of indium gallium arsenide.

7. A semiconductor photodiode in accordance with claim 6 in which the second and third layers are a mesa projecting from the first layer, a layer of insulating material is on the third layer and has an opening therethrough to said third layer, the first contact is on the third layer with the opening in the insulating layer and the second contact is on the first layer and extends around the mesa.

8. A semiconductor photodiode in accordance with claim 4 including a buffer layer of indium phosphide between the first layer and the second layer.

9. A semiconductor photodiode in accordance with claim 4 in which the third layer comprises a first region formed of N type conductivity doped to a first concentration and a second region of N type conductivity doped to a second concentration which extends into the third layer from its surface, said second concentration being greater than said first concentration.

10. A semiconductor photodiode in accordance with claim 9 further comprising an annular groove extending through the third layer and at least a portion of the second layer from the surface of the third layer and circumscribing the second region of the third layer, and a P type conductive region along the sides and bottom of said groove and extending from the bottom of the groove to said first region.

11. A semiconductor photodiode in accordance with claim 10 in which the P type conductive region extends along the surface of the third layer radially away from the groove.

12. A semiconductor photodiode in accordance with claim 11 including a layer of insulating material on the portion of the surface of the third layer circumscribed by the groove, an opening in said insulating layer over the highly doped region, the first contact is on the highly doped region within the opening in the insulating layer, and the second contact is on the portion of the highly doped P type region which extends radially from the groove.

* * * * *